United States Patent
Oruganti et al.

(10) Patent No.: US 12,144,148 B2
(45) Date of Patent: Nov. 12, 2024

(54) PRESSURE BASED PHASE IMMERSION COOLING SYSTEM

(71) Applicant: Microsoft Technology Licensing, LLC, Redmond, WA (US)

(72) Inventors: Vaidehi Oruganti, Kirkland, WA (US); Christian L. Belady, Mercer Island, WA (US); Husam Alissa, Redmond, WA (US); Bharath Ramakrishnan, Bellevue, WA (US); Ruslan Nagimov, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 226 days.

(21) Appl. No.: 17/840,338

(22) Filed: Jun. 14, 2022

(65) Prior Publication Data
US 2023/0403821 A1    Dec. 14, 2023

(51) Int. Cl.
  *H05K 7/20*  (2006.01)
(52) U.S. Cl.
  CPC ......... *H05K 7/203* (2013.01); *H05K 7/20809* (2013.01)
(58) Field of Classification Search
  CPC ................... H05K 7/203; H05K 7/20809
  See application file for complete search history.

(56) References Cited

U.S. PATENT DOCUMENTS

| | | | | |
|---|---|---|---|---|
| 4,619,316 A | * | 10/1986 | Nakayama | F28F 13/187 257/713 |
| 4,694,378 A | * | 9/1987 | Nakayama | H01L 23/427 174/15.1 |
| 8,488,323 B2 | * | 7/2013 | Peterson | H05K 7/20809 361/679.52 |
| 10,512,192 B2 | * | 12/2019 | Miyoshi | H01L 21/67109 |
| 11,533,829 B2 | * | 12/2022 | Alissa | H05K 7/20836 |
| 11,606,878 B2 | * | 3/2023 | Alissa | H05K 7/20381 |
| 11,653,475 B2 | * | 5/2023 | Manousakis | H05K 7/203 361/700 |
| 11,903,166 B2 | * | 2/2024 | Peterson | H05K 7/20327 |
| 11,910,567 B2 | * | 2/2024 | Alissa | H05K 7/20781 |
| 2010/0326628 A1 | * | 12/2010 | Campbell | H05K 7/203 165/185 |

(Continued)

OTHER PUBLICATIONS

"International Search Report and Written Opinion issued in PCT Application No. PCT/US23/019056", Mailed Date: Aug. 9, 2023, 13 Pages.

*Primary Examiner* — Adrian S Wilson
(74) *Attorney, Agent, or Firm* — Workman Nydegger

(57) ABSTRACT

Techniques for dynamically changing a pressure within a pressurized cooling system to thereby allow different cooling rates to be used to cool electronic equipment are disclosed. A pressurized cooling system cools electronic heat generating components using dielectric heat transfer fluid disposed within a two-phase immersion cooling container. This container is operable to maintain different pressure levels. The pressurized cooling system includes a pressure system structured to modify a pressure within the container. The system operates in a first state when the pressure is above a threshold pressure. The system operates in a second state when the pressure is at the threshold pressure. The system operates in either one of the first state or the second state based on an operating state of the heat generating component.

20 Claims, 8 Drawing Sheets

(56) References Cited

U.S. PATENT DOCUMENTS

| | | | |
|---|---|---|---|
| 2010/0328889 A1* | 12/2010 | Campbell | H05K 7/203 |
| | | | 361/699 |
| 2014/0144206 A1* | 5/2014 | Uehlin | G01L 9/0072 |
| | | | 73/1.15 |
| 2014/0216711 A1* | 8/2014 | Shelnutt | F28D 15/0266 |
| | | | 165/104.19 |
| 2017/0013744 A1* | 1/2017 | Shelnutt | H05K 7/203 |
| 2017/0064862 A1* | 3/2017 | Miyoshi | H01L 23/32 |
| 2022/0100241 A1* | 3/2022 | Alissa | H05K 7/203 |
| 2022/0232734 A1* | 7/2022 | Ramakrishnan | H05K 7/20327 |
| 2022/0248557 A1* | 8/2022 | Manousakis | H01L 23/44 |
| 2022/0248559 A1* | 8/2022 | Peterson | H05K 7/20818 |
| 2022/0264761 A1* | 8/2022 | Keehn | H05K 7/20318 |
| 2022/0308643 A1* | 9/2022 | Alissa | G06F 9/45533 |
| 2022/0330452 A1* | 10/2022 | Alissa | H05K 7/20381 |
| 2022/0330453 A1* | 10/2022 | Alissa | H05K 7/20345 |
| 2023/0136452 A1* | 5/2023 | Alissa | H05K 7/203 |
| | | | 361/679.53 |
| 2023/0156960 A1* | 5/2023 | Ramakrishnan | H05K 7/20327 |
| | | | 361/679.53 |
| 2023/0200026 A1* | 6/2023 | Alissa | H05K 7/20836 |
| | | | 361/700 |
| 2023/0225079 A1* | 7/2023 | Alissa | H05K 7/20818 |
| | | | 361/700 |
| 2023/0337396 A1* | 10/2023 | Alissa | H05K 7/203 |
| 2023/0413485 A1* | 12/2023 | Peterson | H05K 7/20336 |

\* cited by examiner

PRESSURE BASED PHASE IMMERSION COOLING SYSTEM

BACKGROUND

Electronics produce a large amount of heat. If this heat is not transferred away from the electronics, then there is a chance that the performance of the electronics can be reduced. Thus, it is highly desirable to provide cooling mechanisms to cool electronic equipment.

Various mechanisms are currently available to cool electronic equipment. For instance, consider a data center that includes many different servers. This data center is likely equipped with a climate control system that includes an air conditioner and multiple different fans. The fans circulate the cool air produced by the air conditioner throughout the room comprising the servers. The servers are cooled when the cooler air is blown over them. Thus, some cooling techniques include air cooling.

Another interesting cooling technique is to place a sealed environment deep in the ocean water. The environment is sealed to prevent water leakage. Servers are placed in the environment. The walls are kept very cool due to the cold temperature of the deep water. Heat can be transferred from the servers to the walls and into the water.

Another interesting cooling technique is single phase or two-phase immersion cooling. With this technique, servers are submerged in a dielectric heat transfer fluid. The boiling point of this fluid is quite low. Because of the low boiling point, heat can be transferred via evaporative cooling.

As indicated above, there are numerous techniques that are available for cooling electronic equipment. Each of these techniques comes with challenges, however. For instance, air cooling techniques are relatively inefficient and provide a "one size fits all approach." Deep water cooling presents challenges with regard to maintenance. Immersion cooling is challenging because, traditionally, there have only been a limited number of different types of dielectric heat transfer fluids that could be used. What is needed, therefore, is an improved technique for transferring heat away from electronic equipment and to do so in an efficient and scalable manner.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein relate to systems, devices, and methods for dynamically changing a pressure within a pressurized cooling system.

Some embodiments are directed to a pressurized cooling system for cooling one or more electronic heat generating components using dielectric heat transfer fluid disposed within a two-phase immersion cooling container. The pressurized cooling system comprises the two-phase immersion cooling container, which is operable to maintain different pressure levels. The system includes a pressure system structured to modify a pressure within the two-phase immersion cooling container. A low-temperature boiling point of the dielectric heat transfer fluid changes when the pressure within the two-phase immersion cooling container changes, thereby enabling use of different cooling rates to cool the heat generating components. The pressurized cooling system operates in a first state when the pressure of the two-phase immersion cooling container is above a threshold pressure (e.g., 1 atmosphere). The pressurized cooling system operates in a second state when the pressure of the two-phase immersion cooling container is at the threshold pressure. The pressurized cooling system operates in either one of the first state or the second state based on an operating state of the heat generating components.

Some embodiments dynamically adjust a pressure within a pressurized cooling system to thereby enable a plurality of different cooling fluids to be used within the pressurized cooling system. The embodiments cause a pressure within the pressurized cooling system to be maintained above a threshold pressure when the pressurized cooling system is operating in a first state. The pressurized cooling system includes a two-phase immersion cooling container; a dielectric heat transfer fluid is disposed within the two-phase immersion cooling container; and one or more electronic heat generating components are fully submerged in the dielectric heat transfer fluid within the two-phase immersion cooling container. The embodiments determine that the one or more electronic heat generating components are transitioning or will subsequently transition from a first operating state to a second operating state. In response to the determination that the one or more electronic heat generating components are currently transitioning or will subsequently transition from the first operating state to the second operating state, the embodiments cause the pressurized cooling system to operate in a second state by lowering the pressure within the pressurized cooling system to the threshold pressure. The process of lowering the pressure results in a low-temperature boiling point of the dielectric heat transfer fluid decreasing. As a result, heat is transferred away from the one or more heat generating components at a faster rate when the pressurized cooling system operates in the second state as compared to when heat was transferred away from the heat generating components when the pressurized cooling system operates in the first state. Later, the embodiments cause the pressured cooling system to operate in the first state by increasing the pressure within the pressurized cooling system to be maintained above the threshold pressure.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
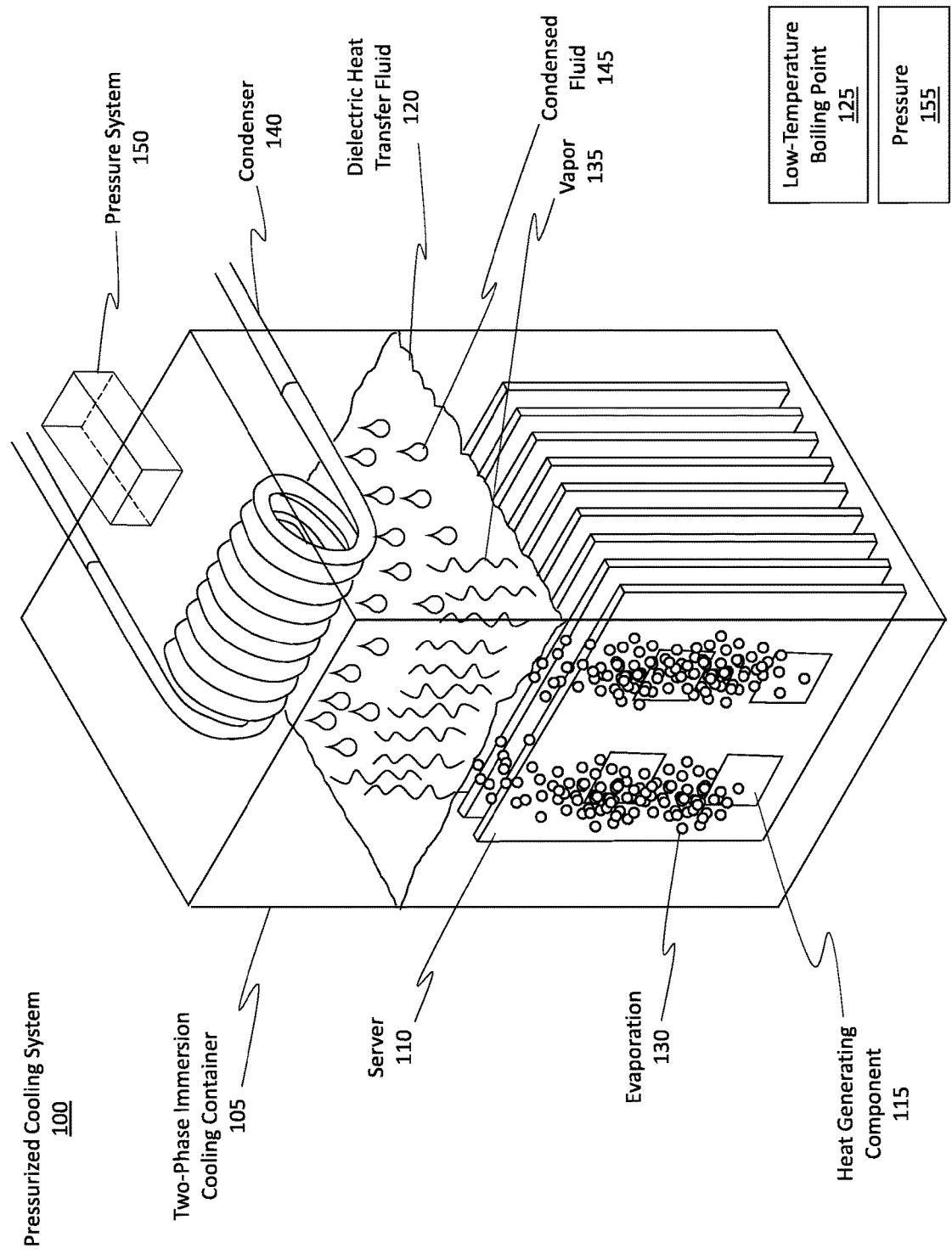
FIG. 1 illustrates an example pressurized cooling system where the internal pressure of the system can be dynamically modified.

Embodiments disclosed herein relate to systems, devices, and methods for dynamically changing a pressure within a pressurized cooling system.

Some embodiments are directed to a pressurized cooling system for cooling electronic heat generating components using dielectric heat transfer fluid disposed within a two-phase immersion cooling container. The system further enables a diverse set of dielectric heat transfer fluids to be used. In some cases, mixtures of multiple different dielectric cooling fluids can be used at the same time to produce an azeotropic mixture.

The system includes the two-phase immersion cooling container, which is operable to maintain different pressure levels. The system further includes a pressure system structured to modify a pressure within the two-phase immersion cooling container. The low-temperature boiling point of the dielectric heat transfer fluid changes when the pressure within the two-phase immersion cooling container changes. The pressurized cooling system operates in a first state when the pressure of the two-phase immersion cooling container is above a threshold pressure (e.g., 1 atm). The pressurized cooling system operates in a second state when the pressure of the two-phase immersion cooling container is at the threshold pressure. The pressurized cooling system operates in either one of the first state or the second state based on an operating state of the heat generating components.

Some embodiments dynamically adjust a pressure within a pressurized cooling system to thereby enable multiple different cooling fluids to be used within the pressurized cooling system. Multiple different cooling fluids can be used at the same time, such as in the case of an azeotropic mixture. Alternatively, one fluid can be swapped out with another fluid at a different time in an effort to provide a different cooling temperature, or rather, a different evaporative cooling temperature.

Some embodiments cause a pressure within the pressurized cooling system to be maintained above a threshold pressure when the pressurized cooling system is operating in a first state. By having the pressure (or pressure "level") be above the threshold pressure, it is not necessarily the case that the pressure remains constant or static. Rather, the pressure can optionally fluctuate above the threshold pressure. In some cases, the pressure can be static, at least for a period of time, above the threshold pressure. The pressurized cooling system includes a two-phase immersion cooling container; a dielectric heat transfer fluid is disposed within the two-phase immersion cooling container; and an electronic heat generating component is fully submerged in the dielectric heat transfer fluid. The embodiments determine that the electronic heat generating component transitioning or will subsequently transition (e.g., based on a planned transition or based on a predicted transition) from a first operating state to a second operating state. In response, the embodiments cause the pressurized cooling system to operate in a second state by lowering the pressure within the pressurized cooling system to the threshold pressure. Lowering the pressure results in a low-temperature boiling point of the dielectric heat transfer fluid decreasing. Heat is then transferred away from the heat generating component at a faster rate when the pressurized cooling system operates in the second state because of the lower evaporation boiling point. The embodiments then cause the pressurized cooling system to operate in the first state by increasing the pressure within the pressurized cooling system to be maintained above the threshold pressure.

Examples Of Technical Benefits, Improvements, And Practical Applications

The following section outlines some example improvements and practical applications provided by the disclosed embodiments. It will be appreciated, however, that these are just examples only and that the embodiments are not limited to only these improvements.

The disclosed embodiments beneficially employ the use of pressure to dynamically change the boiling point of a dielectric heat transfer fluid. By doing so, a broader or more diverse set of different types of dielectric heat transfer fluids can thus be used to cool electronic equipment. Traditionally, immersion cooling techniques were hampered or limited by the fact that only a select set of dielectric heat transfer fluids could be used. These limitations were due, in part, because of the limited range of boiling points for those fluids. Now, by imposing a pressure on those fluids, the embodiments can dynamically change the boiling points of those fluids, thereby enabling different fluids to be used, where those different fluids have different boiling temperatures.

Traditionally, the types of fluids that were used were not ideal for overclocking scenarios, where it is beneficial to significantly reduce the junction temperature of a CPU chip. Now, a more diverse set of fluids can be used (as a result of the dynamic pressure changes), so the embodiments can provide benefits that were not previously available, particularly when a chip is being overclocked.

Another benefit relates to the ability to modify the cooling rates for the electronic equipment. As mentioned above, in some cases, electronic equipment can be "overclocked." The term "overclock" (and its variants) refers to a scenario where a processor or other electronic equipment are set to run at a speed that is higher than it was originally intended to run. In other words, overclocking refers to a scenario where the clock rate of a computer is increased to exceed its certified operational capability. Devices can be overclocked for a period of time to increase the amount of processing they perform. Overclocking a device can result in the generation of more heat, which will need to be dissipated to ensure the device does not become damaged.

The embodiments are beneficially able to dynamically lower the boiling temperature of a dielectric heat transfer fluid. Doing so allows the system to increase the cooling rate that the fluid can provide. Such a feature is particularly beneficial when devices are being overclocked. That is, by decreasing the boiling point of the dielectric heat transfer fluid (thereby increasing the cooling rate the fluid provides), the embodiments are able to significantly reduce the junction temperature of the CPU chip, and changing that junction temperature helps to increase the processing capability or the overclocking ability of the processor. Accordingly, the embodiments provide a tunable technique for improving the processes of a chip when the chip is being overclocked by reducing the junction temperature of the chip.

Another benefits relates to the ability to granularly control the cooling rates for specific servers or specific pressurized cooling systems. Previously, an entire data center may have been cooled using an air conditioning (AC) unit, resulting in a "one size fits all" approach with regard to cooling the various servers. Because each pressurized cooling system can be controlled independently relative to other systems, the embodiments provide a technique for enabling a fine-grained or granular control over cooling techniques.

Yet another benefit relates to decreased energy consumption by the system, and in particular by the condenser. As will be mentioned later, a condenser can be used to condense the dielectric heat transfer fluid when it is in vapor form. When the system operates at higher pressure, the boiling point of the dielectric heat transfer fluid increases. The embodiments are beneficially able to reduce energy consumption in the system because the coolant (e.g., perhaps water) in the condenser will not need to be cooled as much as if the system were operating at 1 atm. Stated differently, the coolant used for the condenser can be kept at a higher temperature, thereby leading to energy efficiencies. Allowing the temperatures to float higher thereby achieves improvements in efficiency and energy consumption.

Yet another benefit relates to the ability to maintain all of the electronic equipment at the same temperature as a result of the boiling temperature of the dielectric heat transfer fluid. Notably, two phase immersion fluids have a higher heat transfer coefficient when compared to air. This results in a lower thermal resistance to heat transfer. A large amount of heat may be dissipated with minimum (or zero) rise in temperature. The disclosed pressure release systems enable improved system performance and present a way to tune over-clocking according to server workloads. The disclosed two-phase immersion cooling system can be coupled with various pressure control systems (e.g., a pressure release or vapor release mechanism) to enable smart, load-driven overclocking and performance boosting. Accordingly, these and many other benefits will now be discussed in more detail throughout the subsequent portions of this disclosure.

Pressurized Cooling System

Attention will now be directed to FIG. 1, which illustrates an example pressurized cooling system 100 capable of providing the benefits mentioned above. The pressurized cooling system 100 is shown as including a two-phase immersion cooling container 105. This container is a type of sealable pressure vessel that can be used to contain a desired pressure therein. The two-phase immersion cooling container 105 is referred to as a "two-phase" unit because it is structured to enable a dielectric heat transfer fluid to be present in both a liquid form and a gaseous form.

Disposed within the interior of the two-phase immersion cooling container 105 is one or more electronic devices, such as perhaps a server 110. Depending on the size of the two-phase immersion cooling container 105, any number of servers can be disposed therein. Notice, the positioning and orientation of the server 110. The server 110 is oriented vertically within the container 105, and other servers are also arranged or oriented vertically. This orientation is particularly beneficial because it prevents gas bubbles from being trapped under a flat surface. If a gas bubble were trapped on the surface of the server 110, the exposed surface may become super-heated and could potentially melt or be damaged.

The server 110 is shown as including one or more heat generating components, such as heat generating component 115. As used herein, the phrase "heat generating component" can be any type of hardware or physical component. Examples of such components include, but certainly are not limited to, a processor, a graphics processing unit (GPU), memory, capacitor, resistor, inductor, or even a heat sink. Indeed, any type of hardware component that produces, generates, or perhaps absorbs (e.g., a heat sink) heat on an electronic device can be included under the classification of a heat generating component.

A dielectric heat transfer fluid 120 is also disposed within the interior of the two-phase immersion cooling container 105. The dielectric heat transfer fluid 120 is a non-conductive substance that can be in liquid form at a given pressure or temperature (e.g., such as HFE7000, nitrogen, etc.). As shown in FIG. 1, the heat generating components are entirely submerged in the dielectric heat transfer fluid 120, and the heat generating components are in direct contact with the dielectric heat transfer fluid 120. In some cases, multiple different dielectric heat transfer fluids can be mixed together within the two-phase immersion cooling container 105. In this manner, one, two, or more than two different fluids may be present in the pressure vessel.

The dielectric heat transfer fluid 120 has a low-temperature boiling point 125. Notably, when no additional pressure is added, then the pressure within the two-phase immersion cooling container 105 will be about 1 atm. When no additional pressure is added (i.e. when operating at about 1 atmosphere (atm)), the low-temperature boiling point 125 is often between about 30 Celsius (C) and about 40 C. If other types of dielectric heat transfer fluids are used (e.g., such as nitrogen), then these boiling point ranges may be different. In most scenarios, however, the ranges are as specified above. As will be described in more detail later, the default (which may also be referred to as "normal") operating condition of the two-phase immersion cooling container 105 is to operate at elevated pressures above 1 atm. As used herein, when the pressure within the two-phase immersion cooling container 105 is not at 1 atm, then the two-phase immersion cooling container 105 is in a first state (e.g., a default state). When the pressure within the two-phase immersion cooling container 105 is at 1 atm, then the two-phase immersion cooling container 105 is in a second state.

An electronic device's heat generating components often reach temperatures above 40 C. Heat can be transferred from the heat generating component 115 to the dielectric heat transfer fluid 120 and then dissipated via an evaporative process. That is, "change of phase heat transfer" (e.g. evaporative cooling or, alternatively, condensation) refers to the process where a liquid is changed into a gas (evaporation) or, alternatively, where a gas is changed into a liquid (condensation), both of which are convection processes.

Evaporation can be used to cool a material (e.g., the heat generating component 115) as a result of the dielectric heat transfer fluid's latent heat being used to transfer heat from the heat generating component 115 by absorbing energy that is required to evaporate the dielectric heat transfer fluid 120. The heat that was absorbed can then be released during condensation.

For instance, FIG. 1 shows how the dielectric heat transfer fluid 120 near the heat generating component 115 is undergoing evaporation 130 because the temperature of the heat generating component 115 is at or exceeds the low-temperature boiling point 125 of the dielectric heat transfer fluid 120. The bubbles shown in FIG. 1 are representative of the evaporation 130 process. When the bubbles reach the surface of the dielectric heat transfer fluid 120, vapor 135 enters the surrounding air or "headspace" of the two-phase immersion cooling container 105.

The pressurized cooling system 100 further includes a condenser 140. A coolant flows through the tubes, and the heat in the vapor 135 can be transferred to the coolant, resulting in the vapor 135 being condensed to condensed fluid 145. The coolant can be cooled by an external cooler. In this manner, the heat generated by the heat generating component 115 can be transferred away.

Figure 2:
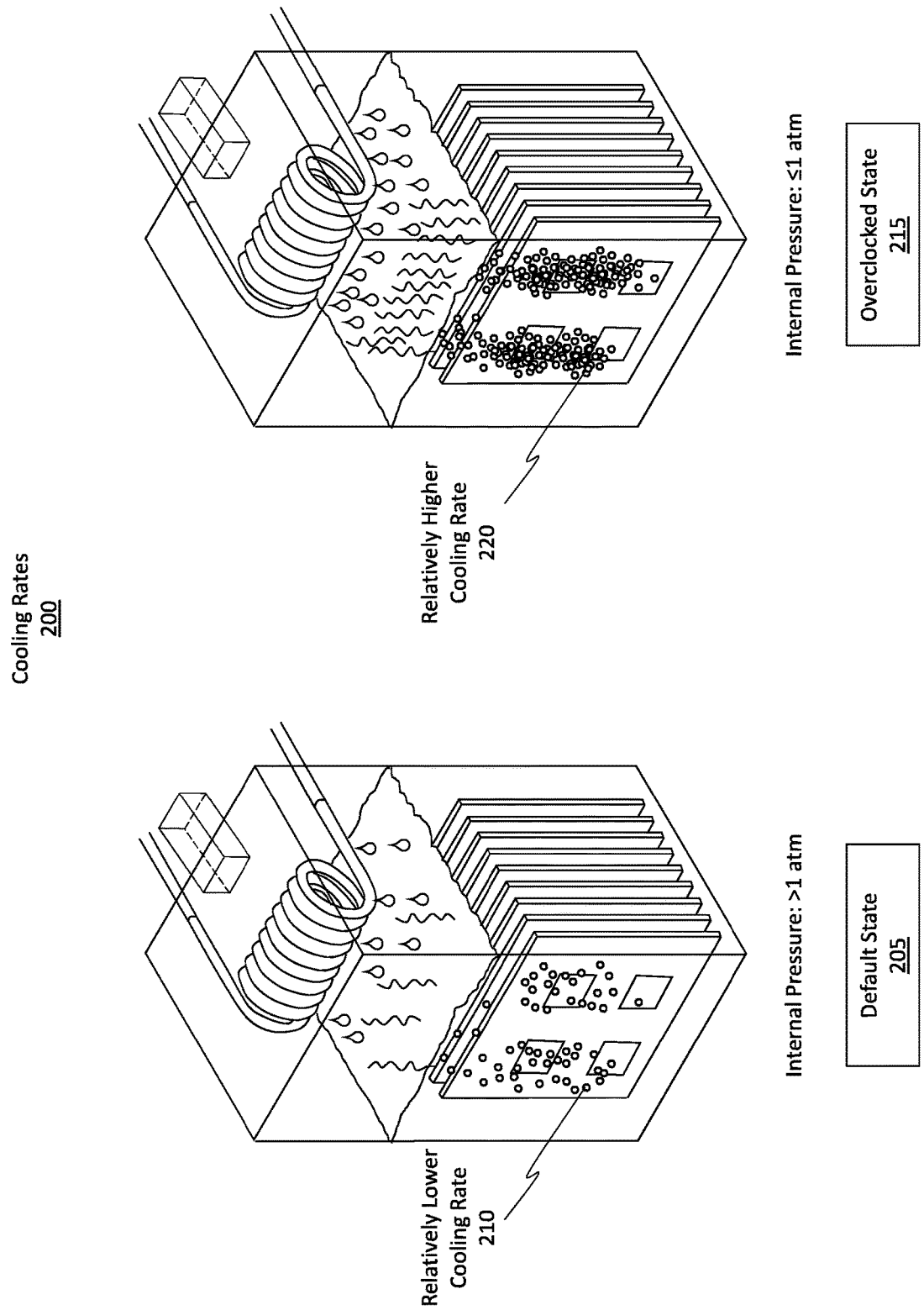
FIG. 2 illustrates how, in accordance with the disclosed principles, changes to the pressure can result in changes to the cooling rates of the system.

The disclosed embodiments are further structured to include a pressure system 150. The pressure system 150 is designed to modify a pressure 155 within the two-phase immersion cooling container 105. By modifying the pressure 155, the embodiments can dynamically control the boiling point of the dielectric heat transfer fluid 120. By controlling the boiling point (and hence the evaporation rate), the embodiments are able to control the cooling rate of the heat generating component 115. FIG. 2 is illustrative.

FIG. 2 shows the differences in cooling rates 200 that can be achieved by dynamically modifying the pressure within the two-phase immersion cooling container 105 of FIG. 1 to thereby change the boiling point of the dielectric heat transfer fluid 120.

In a first scenario, the internal pressure within the container is set to a level that is greater than 1 atm. Notably, this is the default state 205 (i.e. the first state) of the pressure. That is, the first state of the pressurized cooling system refers to a condition where the internal pressure exceeds 1 atm. Stated differently, a default operating pressure (i.e. the pressure when operating in the first state) of the two-phase immersion cooling container is higher than 1 atmosphere (atm) such that the dielectric heat transfer fluid is, by default or under typical operating conditions, subjected to "increased pressure" (increased relative to atmosphere or 1 atm). As a result of operating at a higher pressure, the low-temperature boiling point will also increase. In this regard, the low-temperature boiling point of the dielectric heat transfer fluid is maintained at a relatively higher temperature as compared to when the dielectric heat transfer fluid is not subjected to the increased pressure.

Often, the default operating pressure is between about 1.5 atm and about 3.5 atm (when the system operates in the first state). In some cases, the range is between about 2 atm and about 3 atm. As a result of having a higher pressure, the boiling point of the dielectric heat transfer fluid increases. To illustrate, the low-temperature boiling point of the dielectric heat transfer fluid is often between about 45 C and about 55 C when the dielectric heat transfer fluid is subjected to the increased pressure (e.g., between 2-3 atm). In contrast, the low-temperature boiling point of the dielectric heat transfer fluid is between about 30 C and about 40 C when the dielectric heat transfer fluid is not subjected to the increased pressure.

When in the default state 205 (i.e. pressure higher than 1 atm), the pressurized cooling system operates at a relatively lower cooling rate 210 (e.g., notice fewer bubbles, reflective of a scenario where less evaporative cooling is occurring). The phrase "cooling rate" refers to the amount of heat that is dissipated over time. When the boiling temperature of the dielectric heat transfer fluid is higher, the cooling rate is lower. When the boiling temperature is lower, the cooling rate is higher.

When the electronic equipment is caused to operate in an overclocked state 215 (or perhaps an increased load state), the pressure is dropped or perhaps entirely released within the pressurized cooling system, thereby lowering the boiling point of the dielectric heat transfer fluid and thereby increasing the cooling rate (e.g., because of the lower boiling point). The righthand side of FIG. 2 shows a scenario where the internal pressure is now less than or equal to 1 atm, thereby resulting in a relatively higher cooling rate 220 (e.g., notice more bubbles). The response time for modifying the pressure can essentially be instantaneous.

Once the embodiments detect that the electronic devices are currently or will subsequently be in the overclocked state 215 or in a state of otherwise increased load (e.g., a threshold level of processor usage or memory usage may also be triggering factors), the embodiments can (in real-time and on-demand) react by modifying the pressure within the system. In some cases, the overclocked state 215 is planned beforehand, so the embodiments can prepare for the state. In some cases, the overclocked state 215 is predicted, such as perhaps by a machine learning engine. The embodiments can then cycle the pressure based on this prediction. In some cases, the embodiments are monitoring the workloads of the CPU chips in real time and can respond based on fluctuations to those workloads.

Accordingly, with some embodiments, the pressure system is structured to modify the pressure based on a condition in which one or more servers comprising one or more heat generating components are operating in an overclocked state. In some cases, the pressure system modifies the pressure within the two-phase immersion cooling container based on a load imparted on the one or more heat generating components. In such scenarios, the load may not be sufficient to cause the components to operate in an overclocked state, but the load may still cause the components to operate at a high rate. Thus, dynamically controlling the cooling rates can be beneficial, even when the CPU chips may not be overclocked.

A datacenter may have any number of discrete pressurized cooling systems for any number of different servers. For instance, the data center can be organized to include a discrete pressurized cooling system per zone of servers, per aisle of servers, per rack of servers, or even potentially per individual server. Thus, the pressurized cooling system can be manufactured to accommodate any size requirement. Each of the pressurized cooling systems can be independently controlled. As a consequence, the embodiments have very fine or very granular control over the cooling conditions for specific servers. With traditional air conditioning (AC) based cooling techniques, this level of fine-grained control could not be achieved. By following the disclosed principles, when specific servers are overclocked, the embodiments can dynamically modify the cooling rates for those specific servers. One can appreciate how such control produces substantial benefits, including the ability to help prolong electronic equipment by ensuring they are adequately cooled and including cost savings by allowing for granular control over cooling rates (e.g., as opposed to cooling the entire data center via AC based on an increased need from a single server perhaps).

Accordingly, in some embodiments, the pressure system is structured to drive the pressure within the two-phase immersion cooling container to pressures above 1 atm (e.g., a first state), at 1 atm (e.g., a second state) and/or to pressures even below 1 atm (e.g., a third state). In some cases, the pressure is maintained at 1 atm (i.e. the system operates in the second state).

Figure 3:
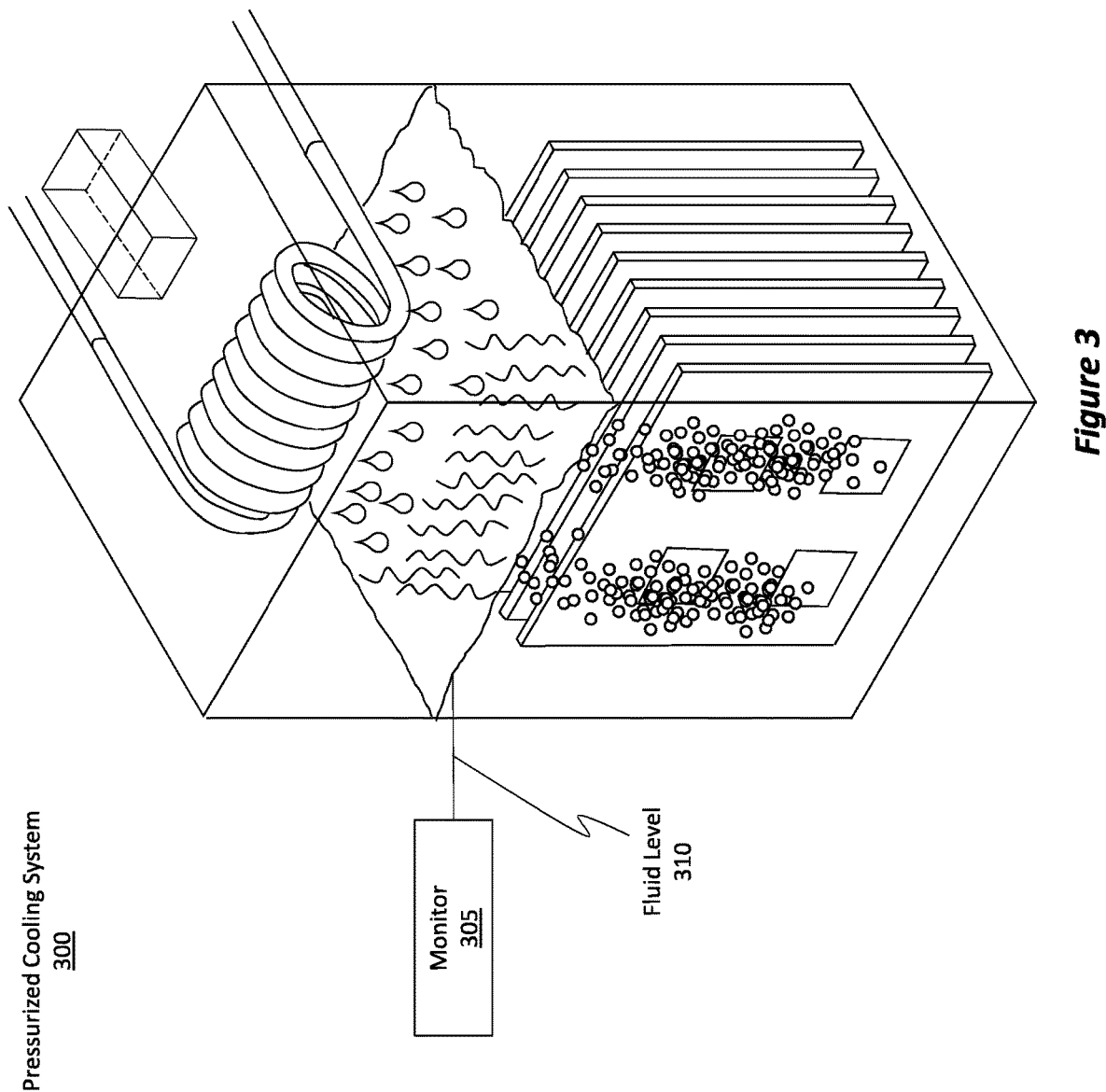
FIG. 3 illustrates how the fluid level of the dielectric heat transfer fluid can be monitored.

FIG. 3 shows a pressurized cooling system 300 that is representative of the systems discussed thus far. The pressurized cooling system 300 is shown as including a monitor 305 for monitoring a fluid level 310 of the dielectric heat transfer fluid. Monitoring the fluid level 310 is advantageous because it helps prevent a scenario where too little dielectric heat transfer fluid is in the pressure vessel (i.e. the two-phase immersion cooling container).

If too little fluid were present, then parts of the electronic equipment may be exposed to air/headspace and may not be able to be cooled via the evaporative cooling technique. Thus, some embodiments monitor the fluid level 310 and can optionally trigger additional dielectric heat transfer fluid to be added to the vessel if the fluid level 310 drops below a threshold level or a buffer level. It may be desirous to maintain a buffer or threshold amount of fluid above the servers so as to ensure that they are not inadvertently exposed and not cooled. Modifying the pressure can also beneficially be used to modify the amount of dielectric heat transfer fluid in the pressure vessel (e.g., by controlling the evaporation rate). That is, pressure modifications can be performed to modify the buffer levels. Higher pressure increases the boiling temperature, which results in less evaporation. Less evaporation results in an increase in the liquid form of the fluid. Accordingly, in some embodiments, the level of the dielectric heat transfer fluid within the two-phase immersion cooling container is monitored.

Accordingly, some embodiments are directed to a pressurized cooling system for cooling one or more electronic heat generating components using dielectric heat transfer fluid disposed within a two-phase immersion cooling container. The pressurized cooling system comprises the two-phase immersion cooling container, which is operable to maintain different pressure levels.

The pressurized cooling system further includes a pressure system structured to modify a pressure within the two-phase immersion cooling container. Notably, a low-temperature boiling point of the dielectric heat transfer fluid changes when the pressure within the two-phase immersion cooling container changes. Changing the pressure enables use of different cooling rates to cool the heat generating components.

The pressurized cooling system operates in a first state when the pressure of the two-phase immersion cooling container is above a threshold pressure (e.g., 1 atm). While the pressurized cooling system operates in the first state, the low-temperature boiling point of the dielectric heat transfer fluid is relatively higher such that less evaporative cooling occurs.

The pressurized cooling system operates in a second state when the pressure of the two-phase immersion cooling container is at the threshold pressure (e.g., 1 atm). While the pressurized cooling system operates in the second state, the low-temperature boiling point of the dielectric heat transfer fluid is relatively lower such that more evaporative cooling occurs.

The pressurized cooling system operates in either one of the first state or the second state based on an operating state of the one or more heat generating components. The operating state of the heat generating components can include an overclocked state, an increased load state (e.g., such as when a processor usage or memory usage exceeds a predefined threshold), or a default load state (e.g., such as when the processor usage or memory usage does not exceed the predefined threshold). For example, the pressurized cooling system can transition from the first state to the second state when servers transition to or will subsequently transition to an overclocked state.

In some cases, the heat generating components include a processor, and the operating state of the process includes (i) a first operating state in which a processor usage of the processor is below a threshold level and (ii) a second operating state in which the processor usage of the processor is above the threshold level.

When the pressurized cooling system is operating in the first state, it is typically the case that the low-temperature boiling point of the dielectric heat transfer fluid is between about 45 C and about 55 C. When the pressurized cooling system is operating in the second state, the low-temperature boiling point is between about 30 C and 40 C.

Techniques For Dynamically Modifying The Pressure Level

Figure 4:
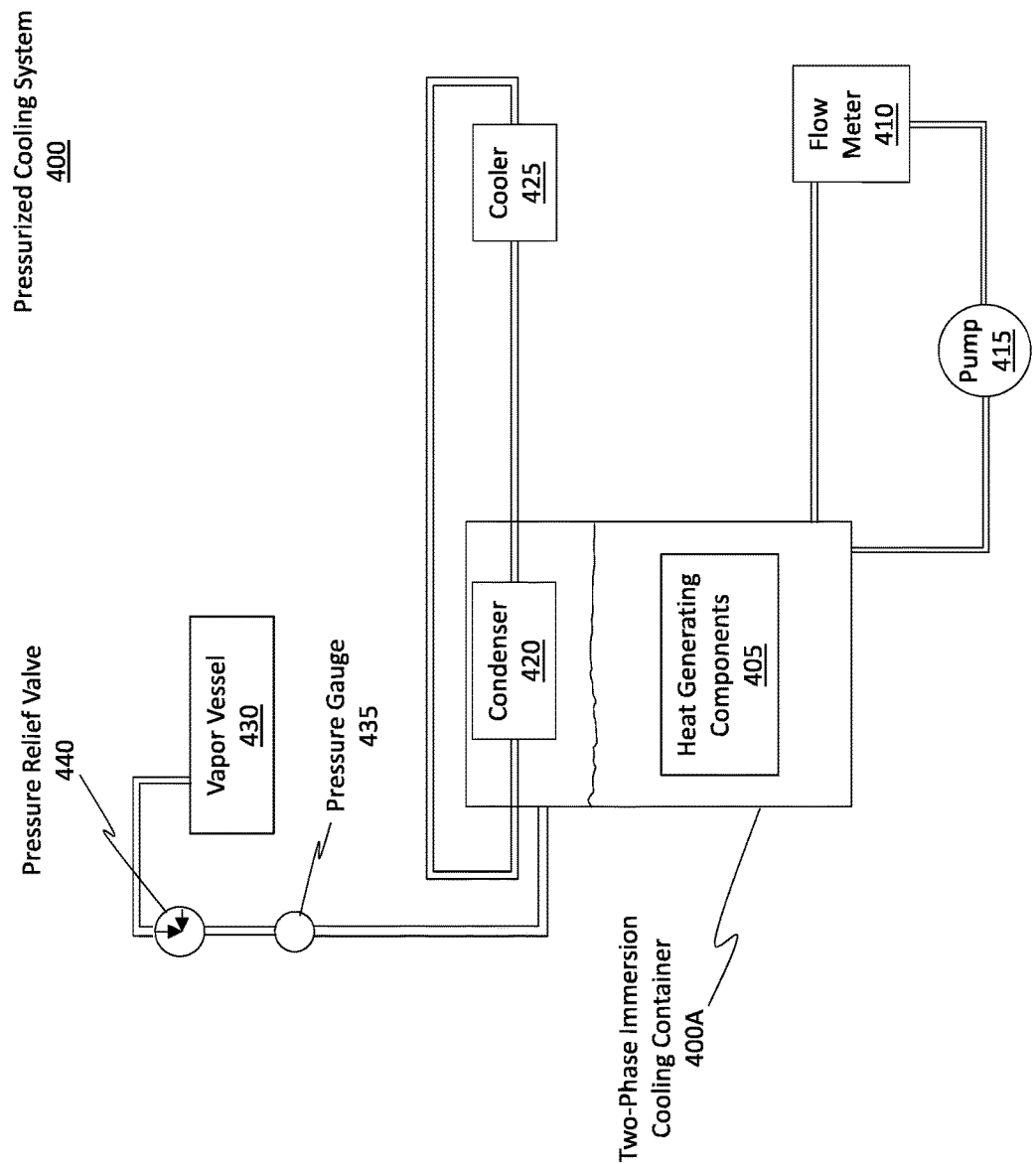
FIG. 4 illustrates an example technique for controlling the pressure, where this technique relies on a pressure relief valve.
Figure 5:
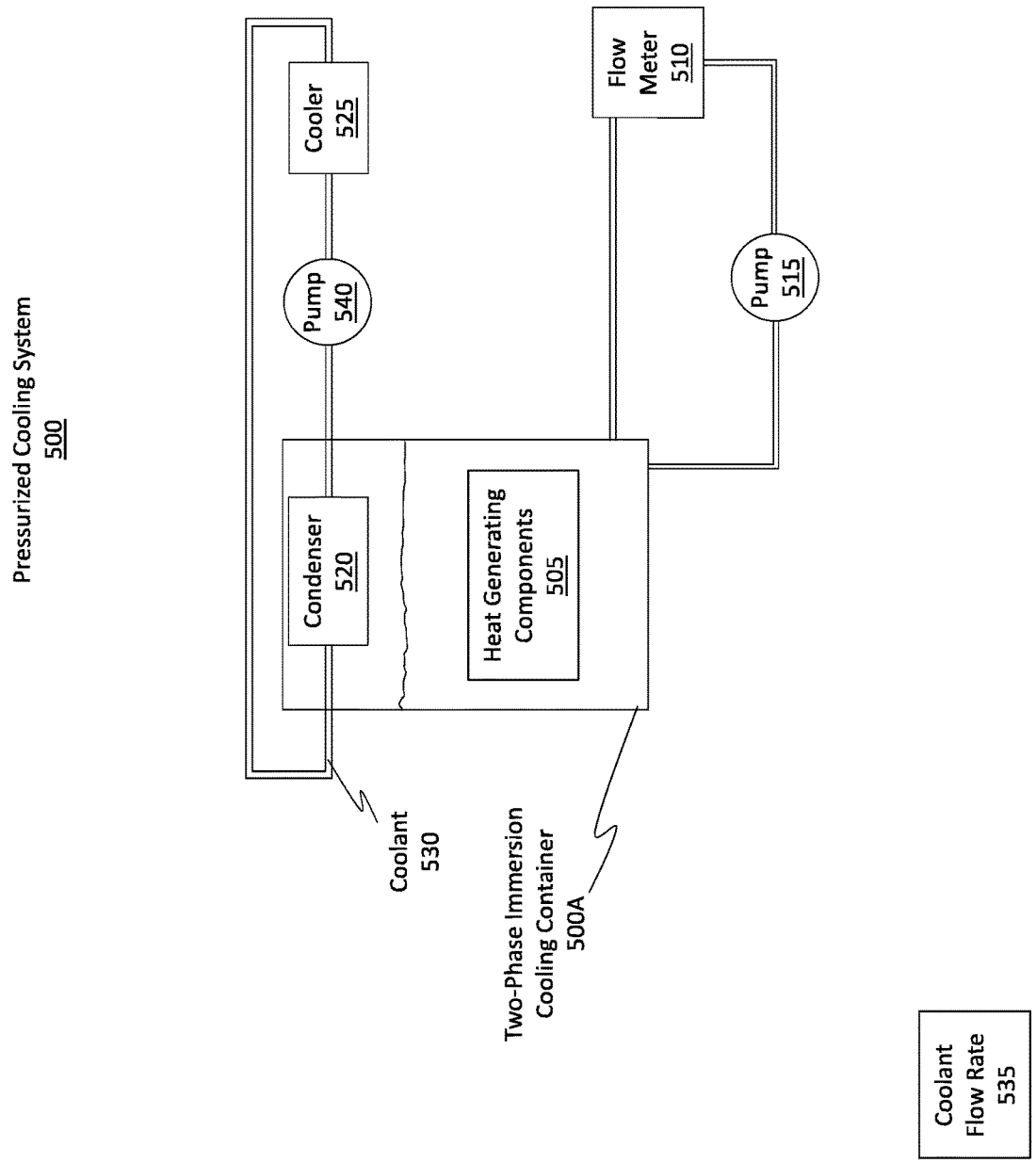
FIG. 5 illustrates another example technique for controlling the pressure, where this technique relies on changes to the coolant flow rate of a coolant that is being pumped through a condenser.
Figure 6:
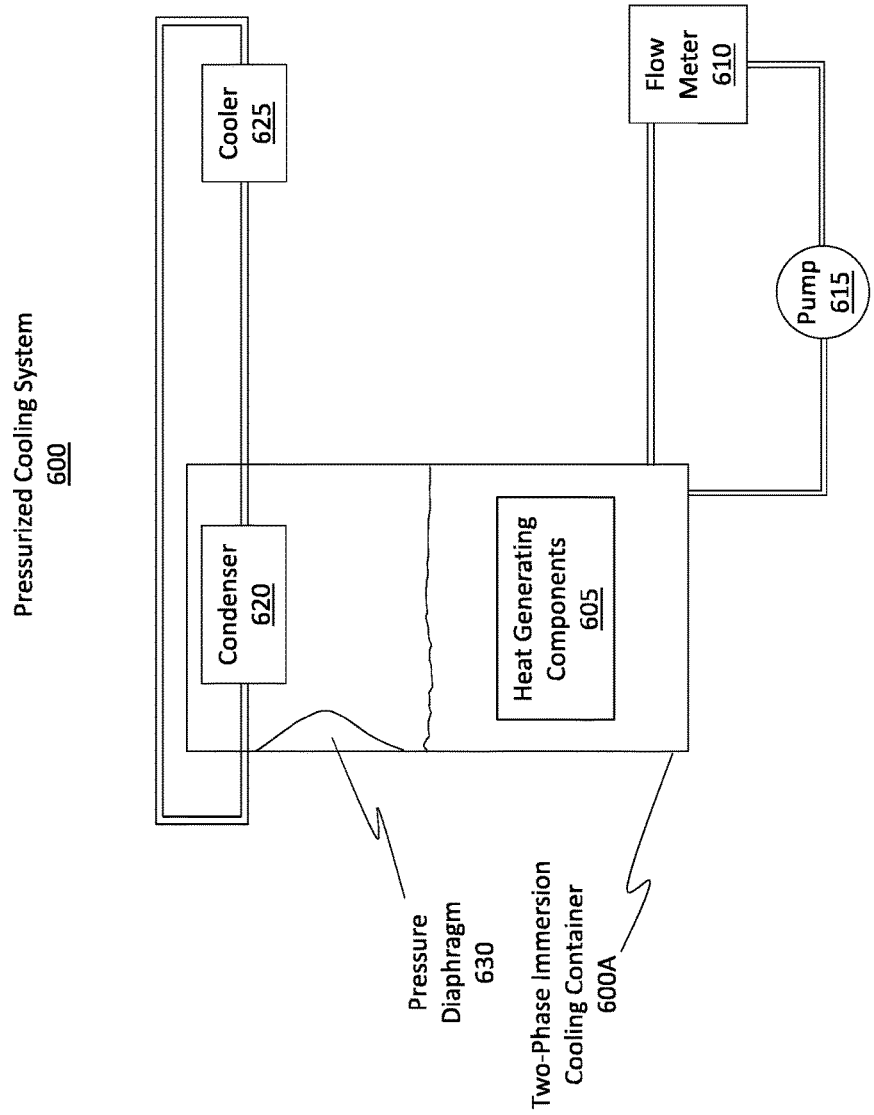
FIG. 6 illustrates another example technique for controlling the pressure, where this technique relies on a pressure diaphragm.

Attention will now be directed to FIGS. 4, 5, and 6. These figures illustrate various different techniques for dynamically modifying the pressure within the pressure vessel, such as those described in FIGS. 1, 2, and 3, in order to achieve the benefit of being able to change the cooling rates for the heat generating components.

FIG. 4 shows a pressurized cooling system 400 that includes a two-phase immersion cooling container 400A and heat generating components 405. In this example scenario, the system also include a flow meter 410 and a pump 415. The flow meter 410 and the pump 415 can be used to fluctuate, cycle, or circulate the dielectric heat transfer fluid (in liquid form) within the system. Circulating the dielectric heat transfer fluid can be beneficial to help prevent bubbles from being trapped (e.g., the circulation disturbs the fluid).

The system also includes a condenser 420, which is representative of the condenser 140 from FIG. 1. Also shown is a cooler 425 that is used to cool the coolant included within the tubing that exists between the condenser 420 and the cooler 425. The coolant can be any type of coolant or refrigerant. In some cases, the coolant is water. In some cases, the coolant can be a type of freon refrigerant.

One example technique for dynamically controlling the pressure within the system is via the use of a vapor vessel 430, a pressure gauge 435, and a pressure relief valve 440. As used herein, the phrase "vapor vessel" refers to a structure that is distinct from the two-phase immersion cooling container 400A (aka the "vessel"). The vapor vessel 430 is a chamber that allows for gas to escape out of the two-phase immersion cooling container 400A, which is shown in FIG. 4 as encompassing the heat generating components 405. As mentioned earlier, the default pressure level of the system is above 1 atm. To achieve this pressure level, the embodiments can be configured to allow the dielectric heat transfer fluid to evaporate to form vapor. The buildup of vapor within the vessel will increase the pressure in the vessel as well. The pressure within the vessel can be monitored via the pressure gauge 435. The pressure gauge 435 can be incorporated into the two-phase immersion cooling container or with tubing that is connected to the two-phase immersion cooling container, such as between the vapor vessel 430 and the two-phase immersion cooling container. Optionally, the pressure can be measured at multiple different locations within the system, such as within the vessel itself and/or outside of the vessel via tubing that is attached. Different pressure measuring sensors can be used as well. If the pressure has not reached a threshold or default pressure level (e.g., typically 2-3 atm), then the pressure relief valve 440 is kept closed, thereby allowing the pressure to build. Once the pressure reaches the threshold level, then the pressure relief valve 440 can be selectively opened or closed to ensure that the pressure remains at or near the threshold level.

When the pressure relief valve 440 is opened, the vapor can be released such as into the vapor vessel 430, where the vapor will then condense and can then be delivered back (in liquid form) to the vessel. Optionally, the condensed liquid in the vapor vessel 430 can remain in the vapor vessel 430 for a period of time or, alternatively, the liquid can be returned or drained back to the two-phase immersion cooling container without delay. In some cases, a liquid level monitor is provided in the two-phase immersion cooling container. When the monitor indicates that the liquid in the two-phase immersion cooling container is below a threshold level, then the embodiments can optionally trigger a valve, thereby causing liquid in the vapor vessel 430 to flow into the two-phase immersion cooling container to raise the levels in the two-phase immersion cooling container. Accordingly, in this example scenario, the pressure system (e.g., pressure system 150 of FIG. 1) can be structured to modify the pressure within the two-phase immersion cooling container via the pressure relief valve 440 (and accompanying pressure gauge 435). The increased pressure within the vessel can be selectively released or controlled when the pressure relief valve 440 is opened. Opening or closing the pressure relief valve 440 can be dependent on whatever state the pressurized cooling system is in. For instance, when the pressurized cooling system transitions from the first state to the second state, then the pressure relief valve 440 can be opened. When the pressurized cooling system transitions from the second state to the first state, then the pressure relief valve 440 can be closed.

Accordingly, in some scenarios, the pressure system is structured to include a vapor vessel 430. The pressurized cooling system transitions from the first state to the second state when pressure in the two-phase immersion cooling container is removed (e.g., perhaps by opening the pressure relief valve 440), and when the vapor form of the dielectric heat transfer fluid escapes to the vapor vessel 430 and is condensed.

In some scenarios, when the increased pressure in the two-phase immersion cooling container is removed, the vapor form of the dielectric heat transfer fluid can be allowed to escape. In some optional scenarios, some of the vapor form is permitted to escape into the vapor vessel 430.

FIG. 5 illustrates another example technique for dynamically controlling the pressure within the vessel. FIG. 5 shows an example pressurized cooling system 500 that includes a two-phase immersion cooling container 500A and heat generating components 505 submerged in a dielectric heat transfer fluid, whose flow is being monitored via a flow meter 510 and which is being circulated via a pump 515. The system also includes a condenser 520 and a cooler 525, as mentioned before. A coolant 530 is provided to transfer the heat away from the vapor form of the dielectric heat transfer fluid so the fluid can condense back to liquid form. As mentioned earlier, this coolant 530 can be water or some other type of refrigerant.

The embodiments are able to dynamically control the coolant flow rate 535 of the coolant 530 through the condenser 520 to dynamically control the pressure within the vessel. That is, by controlling the flow rate of the coolant, the embodiments can increase or decrease the condensation rates for the dielectric heat transfer fluid when it is in vapor form. Slowing the flow rate of the coolant will reduce the condensation rate, which will increase the amount of vapor in the vessel, thereby also increasing the pressure level. In some cases, ambient environmental conditions, such as temperature and pressure, can be monitored. The embodiments can dynamically control the coolant flow rate 535 based on the detected ambient conditions. On the other hand, increasing the flow rate of the coolant will increase the condensation rate, which will decrease the amount of vapor in the vessel, thereby also decreasing the pressure level. Thus, there is an inverse relationship between the coolant flow rate and the pressure level. Higher flow rates lead to lower pressure; and lower flow rates lead to higher pressure. The flow rate of the coolant can be controlled via a pump 540.

FIG. 6 illustrates yet another pressurized cooling system 600 configured to dynamically control the pressure within the vessel. This system includes a two-phase immersion cooling container 600A and heat generating components 605 immersed in dielectric heat transfer fluid, a flow meter 610, a pump 615, a condenser 620, and a cooler 625. The system also include a pressure diaphragm 630.

The pressure diaphragm 630 can be any type of moveable structure designed to modify the pressure within the vessel. Examples of such structures include, but are not limited to, an inflatable bladder, a piston, or any other type of thin, flexible membrane that is moveable to thereby change pressure by modifying the internal volume in the vessel.

As an example, suppose the pressure diaphragm 630 was in the form of an inflatable bladder, which can be a part of the pressurized cooling system. When the bladder is inflated, the pressure within the vessel will increase. When the bladder is deflated, the pressure within the vessel will decrease. In some cases, the pressure can even decrease to levels below 1 atm (e.g., such as when a piston retracks to create a vacuum) (e.g., a third state). Setting the pressure to below 1 atm will also impact the boiling point of the dielectric heat transfer fluid.

Accordingly, various different techniques are available for dynamically altering the pressure within the vessel. In one example scenario, the pressure is modified via use of a pressure relief valve. In another example scenario, the pressure system is structured to modify the pressure within the two-phase immersion cooling container by modifying a coolant flow rate for coolant within the condenser. In yet another example scenario, the pressure system includes a diaphragm structured to modify the pressure within the two-phase immersion cooling container. Each of these techniques can be performed individually or, alternatively, these techniques can be performed in various combinations with one another. Accordingly, any one technique should not be viewed as being mutually exclusive with regard to any other technique.

In another example, the temperature of the dielectric heat transfer fluid can also be cooled via the use of chillers. For instance, tubing can be run through the pressure vessel and can be in contact with the liquid form of the dielectric heat transfer fluid. The tubing can be filled with refrigerant that can operate to cool the dielectric heat transfer fluid as well. This approach can be thought of as a hybrid single phase and two-phase cooling technique. Thus, there are multiple different methodologies for providing cooling functionality.

Example Methods

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 7:
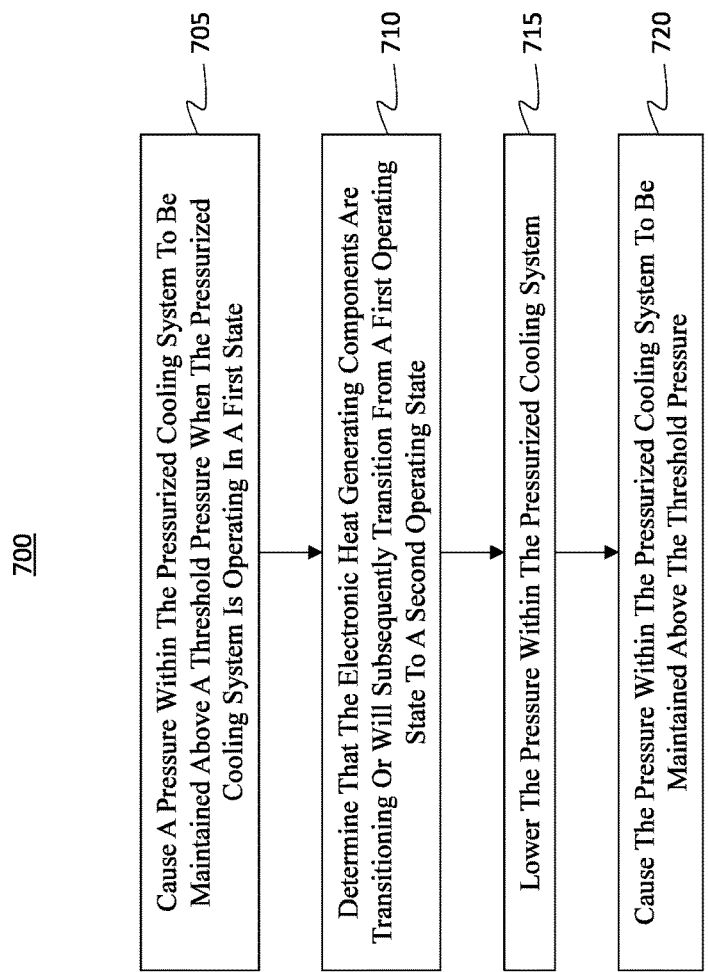
FIG. 7 illustrates a flowchart of an example method for dynamically changing a pressure within the system.

Attention will now be directed to FIG. 7, which illustrates a flowchart of an example method 700 for dynamically adjusting a pressure within a pressurized cooling system to thereby enable a plurality of different cooling fluids to be used within the pressurized cooling system. The method can be practiced using the pressurized cooling system 100 of FIG. 1.

As mentioned, the pressurized cooling system 100 includes a two-phase immersion cooling container, where the two-phase immersion cooling container is a pressure vessel structured to maintain different pressure levels. The system also includes one or more electronic heat generating components disposed within the two-phase immersion cooling container. The system also includes a dielectric heat transfer fluid disposed within the two-phase immersion cooling container.

The two-phase immersion cooling container is filled with the dielectric heat transfer fluid to a level such that the one or more electronic heat generating components are entirely submerged in the dielectric heat transfer fluid and such that the one or more electronic heat generating components are in direct contact with the dielectric heat transfer fluid. The dielectric heat transfer fluid has a low-temperature boiling point that enables heat to be transferred away from the one or more heat generating components as a result of the dielectric heat transfer fluid evaporating (i) when in contact with the one or more heat generating components and (ii) when a temperature of the one or more heat generating components at least reaches the low-temperature boiling point of the dielectric heat transfer fluid.

The system further includes a condenser structured to condense the dielectric heat transfer fluid when the dielectric heat transfer fluid is in vapor form as a result of the evaporating. The system includes a pressure system structured to modify a pressure within the two-phase immersion cooling container. The low-temperature boiling point of the dielectric heat transfer fluid changes when the pressure within the two-phase immersion cooling container changes, thereby enabling use of different cooling rates to cool the heat generating components. In cases where multiple different types of dielectric heat transfer fluids are disposed in the two-phase immersion cooling container 105, those fluids may each have a different boiling point. Thus, different cooling rates can be achieved via the presence of different boiling points. Accordingly, method 700 of FIG. 7 can be implemented using the structure of the pressurized cooling system 100 of FIG. 1.

Method 700 includes an act (act 705) of causing a pressure within the pressurized cooling system to be maintained above a threshold pressure (e.g., 1 atmosphere (atm)) when the pressurized cooling system is operating in a first state. In some cases, the pressure can optionally fluctuate a threshold amount, provided it remains above 1 atm. For instance, a range (aka "buffer" or "buffer range") can be defined, where the pressure can be anywhere within the defined range, such as between 2.2 atm and 2.7 atm (or any other defined range). Fluctuations within that pressure range can be permitted without the system performing corrective action (e.g., triggering the pressure system to increase or decrease the pressure). If the pressure exceeds the defined range, then the system may be triggered to correct the pressure. Small fluctuations (e.g., fluctuations that occur, but the pressure remains within the range) may not be a triggering condition for the system to perform a pressure correcting action (e.g., increasing or decreasing the pressure to cause the pressure to again be within the range). For instance, the pressure level may be maintained between about 1.5 atm and about 3.5 atm. When at this higher or increased pressure, the boiling point of the dielectric heat transfer fluid increases. Often the boiling temperature increases from a normal (unpressurized) point of about 30 C to 40 C to a new or increased (pressurized) boiling temperature of about 45 C to 55 C.

Act 710 includes determining that the one or more electronic heat generating components are transitioning or will subsequently transition from a first operating state (e.g., a reduced load state or a state in which a processor or memory is operating below a threshold level) to a second operating state (e.g., an overclocked state or an increased load state, such as when the processor or memory is operating below the threshold level). The embodiments may determine that the components will enter the overclocked state within a threshold time period.

In response to the determination that the one or more electronic heat generating components are transitioning or will subsequently transition from the first operating state to the second operating state, act 715 includes causing the pressurized cooling system to operate in a second state by lowering the pressure within the pressurized cooling system to the threshold pressure (e.g., 1 atm). Lowering the pressure results in the low-temperature boiling point of the dielectric heat transfer fluid decreasing such that heat is transferred away from the one or more heat generating components at a faster rate when the pressurized cooling system operates in the second state as compared to when heat was transferred away from the heat generating components when the pressurized cooling system operates in the first state.

Lowering the pressure can be performed by opening a pressure relief valve to enable the pressure to escape the two-phase immersion cooling container of the pressurized cooling system. Additionally, or alternatively, lowering the pressure can be performed by modifying a coolant flow rate in the condenser of the pressurized cooling system. Additionally, or alternatively, lowering the pressure can be performed by moving a diaphragm within the pressurized cooling system.

Act 720 then includes causing the pressurized cooling system to operate in the first state by increasing the pressure within the pressurized cooling system to be maintained above the threshold pressure (e.g., 1 atm). For instance, after the electronic components return to a normal state such that they are not in the overclocked state, the embodiments can again increase the pressure in the pressure vessel, thereby increasing the boiling point of the dielectric heat transfer fluid.

By dynamically modifying the pressure, the system is not only able to modify the cooling rates for the electronics but the system also allows for a more diverse set of fluids to be used. Now, fluids that have a wide range of boiling temperatures can be used. Previously, fluids that had a boiling point of around 50 C were used. The embodiments can beneficially stray from that limitation and can use fluids that have different boiling points. In some cases, mixtures of multiple different fluids can be used to produce an azeotropic mixture. Accordingly, substantial benefits can be achieved by following the disclosed principles.

Example Computer/Computer Systems

Figure 8:
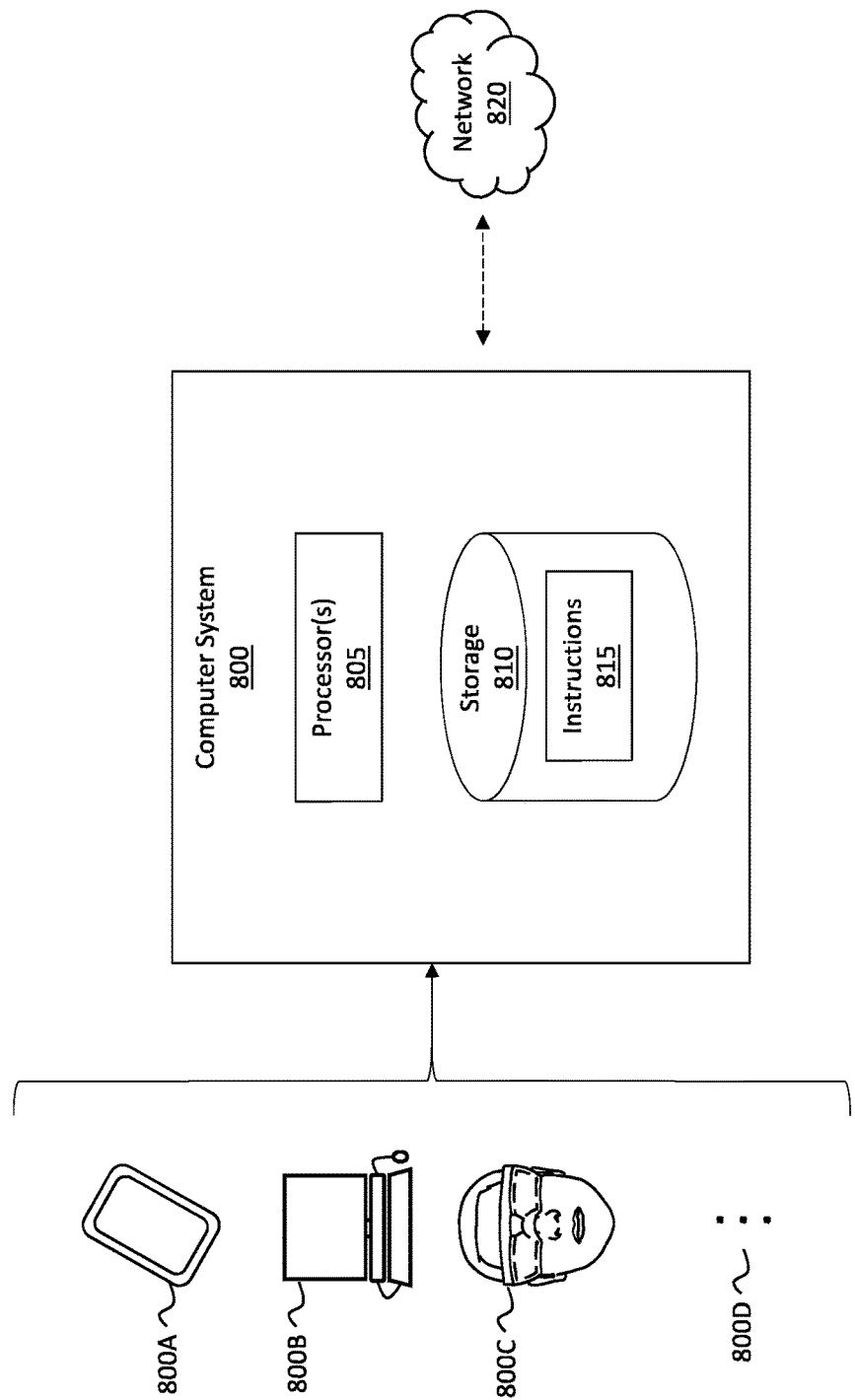
FIG. 8 illustrates an example computer system capable of performing any of the disclosed operations.

Attention will now be directed to FIG. 8 which illustrates an example computer system 800 that may include and/or be used to perform any of the operations described herein. For instance, the computer system 800 can be used to help perform various operations in the method 700. The computer system 800 can be used to control the pressure relief value, the coolant flow rate, or even the pressure diaphragm mentioned previously. The computer system 800 can also monitor the fluid level of the dielectric heat transfer fluid. The computer system 800 can be used in a larger sense to independently control the pressures of multiple different pressurized cooling systems within a datacenter.

Computer system 800 may take various different forms. For example, computer system 800 may be embodied as a tablet 800A, a desktop or a laptop 800B, a wearable device 800C, a mobile device, or any other standalone device, as represented by the ellipsis 800D. Computer system 800 may also be a distributed system that includes one or more connected computing components/devices that are in communication with computer system 800.

In its most basic configuration, computer system 800 includes various different components. FIG. 8 shows that computer system 800 includes one or more processor(s) 805 (aka a "hardware processing unit") and storage 810.

Regarding the processor(s) 805, it will be appreciated that the functionality described herein can be performed, at least in part, by one or more hardware logic components (e.g., the processor(s) 805). For example, and without limitation, illustrative types of hardware logic components/processors that can be used include Field-Programmable Gate Arrays ("FPGA"), Program-Specific or Application-Specific Integrated Circuits ("ASIC"), Program-Specific Standard Products ("ASSP"), System-On-A-Chip Systems ("SOC"), Complex Programmable Logic Devices ("CPLD"), Central Processing Units ("CPU"), Graphical Processing Units ("GPU"), or any other type of programmable hardware.

As used herein, the terms "executable module," "executable component," "component," "module," or "engine" can refer to hardware processing units or to software objects, routines, or methods that may be executed on computer system 800. The phrase "heat generating components" refers to physical or hardware devices. The different components, modules, engines, and services described herein may be implemented as objects or processors that execute on computer system 800 (e.g. as separate threads).

Storage 810 may be physical system memory, which may be volatile, non-volatile, or some combination of the two. The term "memory" may also be used herein to refer to non-volatile mass storage such as physical storage media. If computer system 800 is distributed, the processing, memory, and/or storage capability may be distributed as well.

Storage 810 is shown as including executable instructions 815. The executable instructions 815 represent instructions that are executable by the processor(s) 805 of computer system 800 to perform the disclosed operations, such as those described in the various methods.

The disclosed embodiments may comprise or utilize a special-purpose or general-purpose computer including computer hardware, such as, for example, one or more processors (such as processor(s) 805) and system memory (such as storage 810), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are "physical computer storage media" or a "hardware storage device." Furthermore, computer-readable storage media, which includes physical computer storage media and hardware storage devices, exclude signals, carrier waves, and propagating signals. On the other hand, computer-readable media that carry computer-executable instructions are "transmission media" and include signals, carrier waves, and propagating signals. Thus, by way of example and not limitation, the current embodiments can comprise at least two distinctly different kinds of computer-readable media: computer storage media and transmission media.

Computer storage media (aka "hardware storage device") are computer-readable hardware storage devices, such as RANI, ROM, EEPROM, CD-ROM, solid state drives ("SSD") that are based on RANI, Flash memory, phase-change memory ("PCM"), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 800 may also be connected (via a wired or wireless connection) to external sensors (e.g., one or more remote cameras) or devices via a network 820. For example, computer system 800 can communicate with any number devices or cloud services to obtain or process data. In some cases, network 820 may itself be a cloud network. Furthermore, computer system 800 may also be connected through one or more wired or wireless networks to remote/separate computer systems(s) that are configured to perform any of the processing described with regard to computer system 800.

A "network," like network 820, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 800 will include one or more communication channels that are used to communicate with the network 820.

Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RANI and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A pressurized cooling system for cooling one or more electronic heat generating components using dielectric heat transfer fluid disposed within a two-phase immersion cooling container, said pressurized cooling system comprising:
the two-phase immersion cooling container operable to maintain different pressure levels; and
a pressure system structured to modify a pressure within the two-phase immersion cooling container, a low-temperature boiling point of the dielectric heat transfer fluid changes when the pressure within the two-phase immersion cooling container changes, thereby enabling use of different cooling rates to cool the one or more heat generating components,
wherein:
the pressurized cooling system operates in a first state when the pressure of the two-phase immersion cooling container is above a threshold pressure,
the pressurized cooling system operates in a second state when the pressure of the two-phase immersion cooling container is at the threshold pressure,
the pressurized cooling system operates in either one of the first state or the second state based on an operating state of the one or more heat generating components, and
the pressure system modifies the pressure within the two-phase immersion cooling container based on a load imparted on the one or more heat generating components.

2. The pressurized cooling system of claim 1, wherein the one or more heat generating components includes a processor, and wherein the operating state of the processor includes (i) a first operating state in which a processor usage of the processor is below a threshold level and (ii) a second operating state in which the processor usage of the processor is above the threshold level.

3. The pressurized cooling system of claim 2, wherein the threshold pressure is 1 atmosphere (atm), and wherein the pressure of the two-phase immersion cooling container when the pressurized cooling system is operating in the first state is between about 1.5 atm and about 3.5 atm.

4. The pressurized cooling system of claim 2, wherein the low-temperature boiling point of the dielectric heat transfer fluid is between about 45 Celsius (C) and about 55 C when the pressurized cooling system operates in the first state.

5. The pressurized cooling system of claim 4, wherein the low-temperature boiling point of the dielectric heat transfer fluid is between about 30 C and about 40 C when the pressurized cooling system operates in the second state.

6. The pressurized cooling system of claim 2, wherein the pressure system is structured to modify the pressure within the two-phase immersion cooling container via a pressure relief valve, and wherein, when the pressurized cooling system transitions from the first state to the second state, the pressure is released when the pressure relief valve is opened.

7. The pressurized cooling system of claim 2, wherein the pressure system is structured to modify the pressure within the two-phase immersion cooling container by modifying a coolant flow rate for coolant within a condenser that is included as a part of the pressurized cooling system.

8. The pressurized cooling system of claim 1, wherein the dielectric heat transfer fluid includes HFE7000 or nitrogen.

9. The pressurized cooling system of claim 1, wherein the one or more heat generating components includes one or more servers, wherein the operating state of the one or more servers includes an overclocked state, and wherein the pressurized cooling system transitions from the first state to the second state when the one or more servers are in the overclocked state.

10. The pressurized cooling system of claim 1, wherein the pressure system includes a diaphragm structured to modify the pressure within the two-phase immersion cooling container.

11. The pressurized cooling system of claim 2, wherein the pressure system includes a vapor vessel, and wherein the pressurized cooling system transitions from the first state to the second state when vapor form of the dielectric heat transfer fluid escapes to the vapor vessel and is condensed.

12. The pressurized cooling system of claim 1, wherein the pressure system is structured to drive the pressure within the two-phase immersion cooling container to pressures above 1 atmosphere (atm) or to pressures below 1 atm.

13. The pressurized cooling system of claim 12, wherein the pressure system is further structured to drive the pressure to be at 1 atm.

14. The pressurized cooling system of claim 1, wherein a level of the dielectric heat transfer fluid within the two-phase immersion cooling container is monitored.

15. A method for dynamically adjusting a pressure within a pressurized cooling system to thereby enable a plurality of different cooling fluids to be used within the pressurized cooling system, said method comprising:

causing a pressure within the pressurized cooling system to be maintained above a threshold pressure when the pressurized cooling system is operating in a first state, wherein the pressurized cooling system includes:
        a two-phase immersion cooling container;
        a dielectric heat transfer fluid disposed within the two-phase immersion cooling container; and
        one or more electronic heat generating components fully submerged in the dielectric heat transfer fluid within the two-phase immersion cooling container;
    determining that the one or more electronic heat generating components are transitioning or will subsequently transition from a first operating state to a second operating state;
    in response to the determination that the one or more electronic heat generating components are currently transitioning or will subsequently transition from the first operating state to the second operating state, causing the pressurized cooling system to operate in a second state by lowering the pressure within the pressurized cooling system to the threshold pressure, wherein lowering the pressure results in a low-temperature boiling point of the dielectric heat transfer fluid decreasing such that heat is transferred away from the one or more heat generating components at a faster rate when the pressurized cooling system operates in the second state as compared to when heat was transferred away from the heat generating components when the pressurized cooling system operates in the first state; and
    causing the pressurized cooling system to operate in the first state by increasing the pressure within the pressurized cooling system to be maintained above the threshold pressure.

16. The method of claim 15, wherein lowering the pressure is performed by opening a pressure relief valve to enable the pressure to escape the two-phase immersion cooling container of the pressurized cooling system.

17. The method of claim 15, wherein lowering the pressure is performed by modifying a coolant flow rate in a condenser of the pressurized cooling system.

18. The method of claim 15, wherein lowering the pressure is performed by moving a diaphragm within the pressurized cooling system.

19. A pressurized cooling system for cooling one or more electronic heat generating components using dielectric heat transfer fluid disposed within a two-phase immersion cooling container, said pressurized cooling system comprising:

the two-phase immersion cooling container operable to maintain different pressure levels;
    a pressure system structured to modify a pressure within the two-phase immersion cooling container, a low-temperature boiling point of the dielectric heat transfer fluid changes when the pressure within the two-phase immersion cooling container changes,
    wherein:
        the pressurized cooling system operates in a first state when the pressure of the two-phase immersion cooling container is above 1 atmosphere (atm),
        the pressurized cooling system operates in a second state when the pressure of the two-phase immersion cooling container is at 1 atm,
        the pressurized cooling system operates in either one of the first state or the second state based on an operating condition of the one or more heat generating components, and
        the pressure system modifies the pressure within the two-phase immersion cooling container based on a load imparted on the one or more heat generating components.

20. The pressurized cooling system of claim 19, wherein the pressurized cooling system further includes a pressure diaphragm.

* * * * *